United States Patent [19]

Devlin

[11] 4,289,922

[45] Sep. 15, 1981

[54] INTEGRATED CIRCUIT PACKAGE AND LEAD FRAME

[75] Inventor: Daniel J. Devlin, Torrance, Calif.

[73] Assignee: Plessey Incorporated, New York, N.Y.

[21] Appl. No.: 71,870

[22] Filed: Sep. 4, 1979

[51] Int. Cl.³ .............................................. H05K 5/02
[52] U.S. Cl. ................................. 174/52 FP; 357/70; 361/421
[58] Field of Search ...................... 174/52 FP; 357/70; 361/421; 29/591, 589

[56] References Cited

U.S. PATENT DOCUMENTS

| | | | |
|---|---|---|---|
| 3,676,748 | 7/1972 | Kobayashi et al. ................ | 361/421 |
| 3,689,683 | 9/1972 | Paletto et al. .............. | 174/52 FP X |
| 4,079,511 | 3/1978 | Grabbe ....................... | 174/52 FP X |
| 4,089,733 | 5/1978 | Zimmerman ............... | 174/52 FP X |

*Primary Examiner*—Gene Z. Rubinson
*Assistant Examiner*—D. A. Tone
*Attorney, Agent, or Firm*—James J. Burke, II

[57] ABSTRACT

An improved integrated circuit ceramic package meeting JEDEC-11 standards and having a nominal pin (lead) count of from 24 to 156. Control measures and assembly procedures referenced to the precise center of the die-attach area provide closer dimensional control and lead coplanarity which facilitate automatic die-attach and wire-bonding operations. A lead frame is provided with both diagonal and axial (X-Y) registration points, and internal and external lead tie-bars. It is precisely attached in special tools to a ceramic cover element, and the internal tie bars are sheared off. The cover sub-assembly is then secured to a ceramic base in similar tools. Devitrification of the sealing glass follows. The external tie bars form a convenient carrier protecting the leads, and the registration points provide precise siting for die-attach and wire bonding.

2 Claims, 11 Drawing Figures

INTEGRATED CIRCUIT PACKAGE AND LEAD FRAME

BACKGROUND OF THE INVENTION

The present invention relates in general to packages for integrated circuits and, more particularly, it relates to ceramic flat packages. While the invention will be described with reference to square or so-called "quad" or "chip carrier" packages, the principles of same are equally applicable to the well-known dual-in-line or "DIP" configuration. Both square and rectangular frames and packages may be referred to as "quadrilateral."

The growing demand for larger and more complex integrated circuitry, plus design advances allowing packing of more and more circuit elements on only a small area or "real estate" of silicon, have not been matched by corresponding advances in package design. Of these two factors, volume of demand has created the more serious problems, insofar as while automatic or automated die attach and wire bonding machines are available, their application and usage have been limited by package design per se as well as dimensional tolerances that are too great for optimum utilization.

Integrated circuit packages take many forms, but in general they include a substrate which may include a shallow cavity which holds the silicon die or chip, either a metallized and plated lead pattern or a metallic lead frame having inner lead tips surrounding the cavity and leads extending out to the edge of the substrate where the leads (in a frame) are bent in a suitable configuration for electrical connection into a socket, circuit board or whatever.

Plated patterns must also generally be attached to metal leads near the outer substrate edge or to a carrier or plug-in for connection to a circuit.

Lead frames are so named because, as formed by stamping or etching, all the leads for a device are held together by an outer, connecting frame. As the number of leads gets larger lead inner-tips must also be held in place with an internal tie bar, and the intermediate tie bars are often needed. All such frame and tie-bar elements are ultimately removed so that each lead is electrically isolated from its neighbors, but not before the package assembly is complete and the leads are firmly sealed in position.

The operation called die attach secures the die in the bottom of the cavity, and wire bond is the operation of connecting individual contact pads on the die with individual inner lead tips, generally with extremely fine gold or aluminum wire.

Lastly, the cavity is hermetically sealed with a cover. Die attach and sealing may involve metallurgical bonds, glassy bonds or compounds such as plastics and epoxies. Wire bonding must involve a metallurgical bond, generally created by thermocompression or ultrasonic methods. All of the foregoing is generally known in the art, and there are many variations.

The problem that is created with existing package designs and dimensional tolerances is that the die, after attachment in the substrate cavity, is either positioned with reference to the substrate but not the bond area or the leads, or with reference to the bond area but not the substrate or leads, or with reference to the leads but not the bond area or substrate.

The next result is that the contact pads and the lead tips are not in their proper relation to each other, and even wire bonders with pattern recognition capability can make errors or be greatly slowed.

The foregoing lead-tip/contact pad problem may be considered as existing in plan view, e.g. when the package and die are viewed from above. Another problem exists in elevation or side view: existing package designs and assembly procedures allow lead height variation and lack of strict parallelism between the plane of the die and the plane of leads. Automated wire bonders are also sensitive to such variations.

PRIOR ART

Insofar as known, effects of prior workers toward overcoming the above-enumerated problems have been directed toward accommodating tolerances and design instabilities rather than overcoming them. More particularly, efforts have been made to introduce a "buffer" between the lead frame or other circuit element and the die, whereby accumulative tolerance can be tolerated without connection failure. Alternately, efforts have been made to improve placement accuracy of registration holes when certain chip assemblies are mounted on flexible film carriers. These expedients may be satisfactory, for example, on 24 or even 40 lead packages, but as the lead count goes up yields fall and when it is in the eighties or even exceeds 100, become unsatisfactory solutions.

It is noted, also, that stamped lead frames include registration and/or pilot holes necessary for the indexing of metal strip through successive carbide dies in a sequential or progressive stamping operation. Most often, however, such holes have been removed before the package reaches the die-attach stage. Again, as lead counts climb over the fifties, limits of stamping technology are reached, even where volume of demand supports the cost of the dies. In this high-lead count LSI (large-scale integration) package domain, etched frames are most often used.

The following recent patents are considered exemplary of efforts to achieve desired alignments and planarity, but are not deemed anticipatory of the present invention.

U.S. Pat. No. 4,056,681 discloses an interconnecting die between the circuit die and the package lead frame. Raised portions form guide means between the two elements.

U.S. Pat. No. 4,079,511 discloses a pre-formed spider assembly connecting the circuit die to the lead frame. Buit-in compliance in the former accommodates non-co-planarity of the latter.

U.S. Pat. No. 4,049,903 discloses a lead frame formed on flexible film, including an etched metal sprocket hole to improve registration accuracy of the film.

U.S. Pat. No. 4,139,726 discloses leads soldered to metallized package portions to minimize problems caused by external lead stresses.

U.S. Pat. No. 4,141,712 does not address registration and location problems per se but is of interest because of disclosing a "window frame" frame and cover, with attachment of the lead frame thereto, followed by punching out of the lead-connecting window. These features are part of the assembly process of the present invention. Of lesser interest, stamped lead frames with break-off tabs are disclosed in the '712 patent supra and in earlier U.S. Pat. No. 4,137,546, assigned to the same assignee as the instant application.

OBJECTS OF THE INVENTION

A general object of the present invention is to provide a semiconductor integrated circuit package wherein the die-attach area, ceramic substrate, leads and lead tips are all positioned with reference to external coordinates, whereby unspecified accumulative tolerance errors are avoided.

Another object of the present invention is to provide a semiconductor integrated circuit package wherein lead tips are co-planar and parallel with the die-attach area.

A further object of the present invention is to provide assembly procedures and fixtures capable of producing packages meeting the criteria of the foregoing objects, with no lower dimensional tolerances than currently available, state-of-the-art stamped or etched lead frames and stamped or pressed ceramic parts.

Yet another object of the present invention is to provide a package, assembly procedures and fixtures meeting the criteria of all of the foregoing objects, and further being of a standardized configuration.

Various other objects and advantages of the invention will become apparent from the following description of embodiments, and the novel features will be particularly pointed out in connection with the appended claims.

THE DRAWINGS

Reference will hereinafter be made to the accompanying drawings, wherein.

SUMMARY OF THE INVENTION

In one aspect, the invention involves design of a lead frame including internal tie bars, and one or preferably two sets of external registration points all referenced to the exact geometrical center of the die-attach area. The first set of registration points is diagonal of the frame, and is used for precise positioning of all elements through die-attach, wire bond and seal. The second set of registration points is axial (e.g. X—Y), and is used for referencing the ceramic elements and the lead frame during assembly. It is possible, however, to use either set of registration points interchangeably, as set forth below.

A further aspect of the invention involves fixtures including positioning pins rather than cavities, and having precisely ground planar surfaces where, with normal attention during assembly, precise co-planarity and parallelism can be assured.

In a particularly novel aspect of the invention, the axial X—Y registration points in the frame are formed as slots registering with corresponding pins on the fixture(s), whereby inevitable differential thermal expansion caused by hot-stage assembly steps introduces only nominal and acceptable tolerances in positioning.

In less critical packages, particularly those with a lead count of under 50, the use of a single set of registration holes is generally satisfactory.

DESCRIPTION OF EMBODIMENTS

Figure 1:
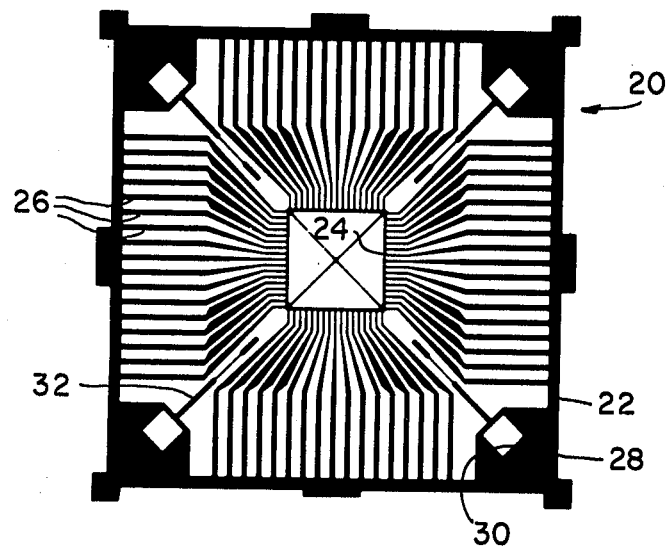
FIG. 1 is a plan view of a 68-lead frame for use in the invention.
Figure 2:
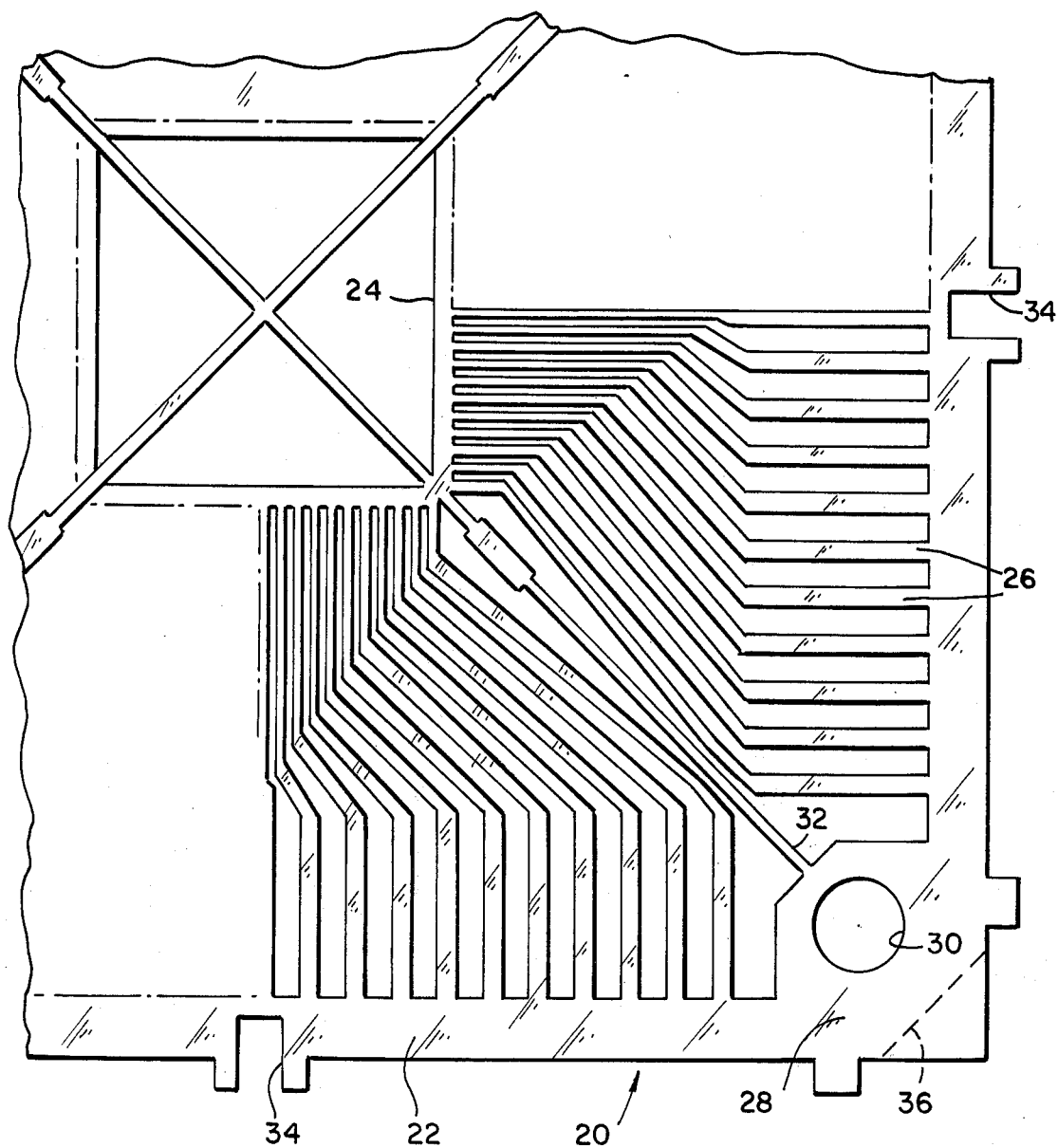
FIG. 2 is a greatly enlarged plan view of one-fourth of a preferred, 84-lead frame for use in the invention.

Lead frames suitable for use with the invention will be considered first, and attention is directed to FIGS. 1 and 2. FIG. 1 illustrates an entire, 68-lead frame 20, including outer frame element 22, internal tie bars 24 including an internal "x", and leads 26 extending therebetween, seventeen on each side. Conventionally, frame 20 is manufactured from a suitable glass-sealing alloy such as F-15, Alloy 42 or other ferrous metal composition, generally from 20 mil or less thick stock, by etching or stamping. As noted supra, etching is the method of choice for high-lead count frames. In practice, frame 20 measures about 1.25 in. across.

Frame 20 also includes solid corners 28 at each corner and integral with outer frame 22. Within each corner area 28 there is a registration hole 30 centered precisely on the diagonal of frame 20. Moreover, each corner 28 includes a diagonal beam 32 extending toward the frame center but not reaching it, which is ultimately attached to the package and serves to further stabilize the corner areas.

Frame 20 as illustrated also includes tab elements extending out from outer frame 22, but these merely facilitate manufacture in strips that are subsequently sheared into individual frames. It will be understood that frame 20 may be nickel and gold plated, the inner leads may be aluminized and the outer leads gold plated, or finished in whatever other manner is required.

FIG. 2 is a greatly enlarged view of one-quarter of an 86-lead frame, and parts similar to those in FIG. 1 have the same reference numerals. In the FIG. 2 embodiment, however, the registration holes 30 are round rather than square, and beams 32 connect the corners with the internal tie bar 24. Additionally, the frame of FIG. 2 includes four slots 34 (two shown) in outer frame 22 precisely midway between the corners or, more correctly, on the X—Y axis of the frame.

For reasons set forth below, registration holes 30 are about 100 mils, but slots 34 are only 50 mils.

On all frames, it is preferred that one corner have a 45° cut-off, as indicated at 36, to insure proper orientation (though the frame is symmetrical, one side may be aluminized, so orientation can be important).

The important aspect of the frame design of FIG. 2 is that both sets of external registration points are referenced to the center of the frame ("X marks the spot") which, as will appear infra, will be the design center of the die attach area.

Ceramic parts used in the invention conform to the standard proposed by JEDEC Committee 11. This is in essence a 950 mil square base 50 mils thick, with a 350 mil square cavity that is 15 mils deep. The cover ring may have the same outer dimensions as the base or may be smaller (840 mils) to allow top probe contact with the outer leads. In either case, the cover ring opening is 420 mils square. Bases and cover rings may have small square cut-outs at three corners and a 45° flat at the fourth, so that orientation can be assured. Ceramic bases may be either laminated from parts stamped from green ceramic or be pressed parts; cover rings are generally stamped. Ceramic parts are generally made of 90% to 96% Al₂O₃ (white), but black alumina or beryllia are preferred in some instances. Ceramic manufactures guarantee flatness of such parts to 4 mils per inch, and can usually do better than this, which is preferred for the present invention.

Figure 3:
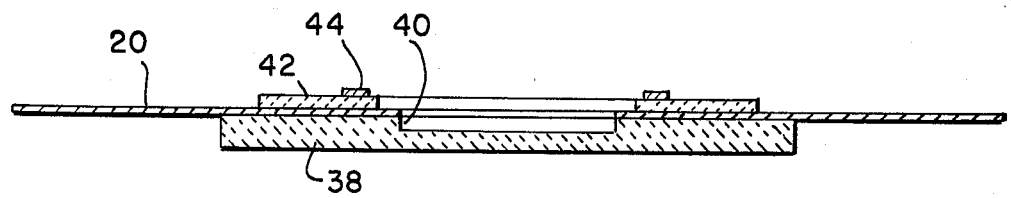
FIGS. 3-7 are elevation views of packages illustrating various lead configurations.

FIG. 3 is an elevation view of a finished package including lead frame 20, base 38 with cavity 40, cover ring 42 having a seal ring 44. It will be appreciated that the die attach area on the bottom may or may not be metallized and plated, usually with gold, (Ni/Au) and there may or may not be a plated seal ring, depending on how the die and cover or lid are to be attached.

Figure 4:
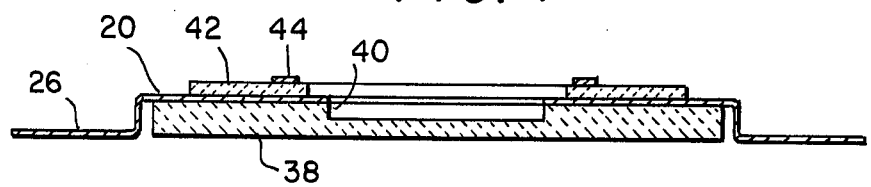
Figure 5:
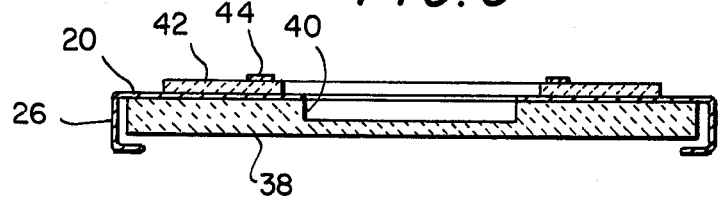
Figure 6:
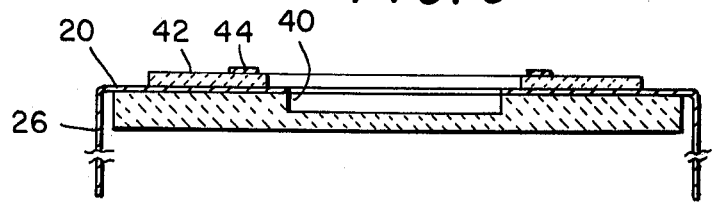
Figure 7:
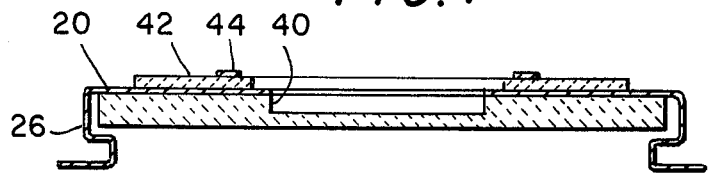

FIGS. 4-7 illustrate various possible lead configurations: FIG. 4 shows the flat pack configuration wherein leads 26 are bent down to the level of the bottom of base 38 and out. In FIG. 5, leads 26 are bent in a "U" shape under the base, called a chip carrier configuration. In FIG. 6, leads are bent straight down for through-hole mounting. FIG. 7 shows a high compliance chip carrier mounting with the leads bent in an "S" shape. "Compliance" refers to the ability of a package to absorb stresses created by differential thermal expansion of the package and the circuit board. In severe environments this is a significant problem.

With lead frames and ceramic parts in hand, the last step before assembly is coating the ceramics with solder glass. This is done by screen printing in one or more stages to achieve a coating thickness of about 5-15 mils, which is dried and melted to cover the entire bottom of the cover 42 and the top surface of base 38. Conventional procedures and solder glasses, all well known in the art, are employed.

Figure 8:
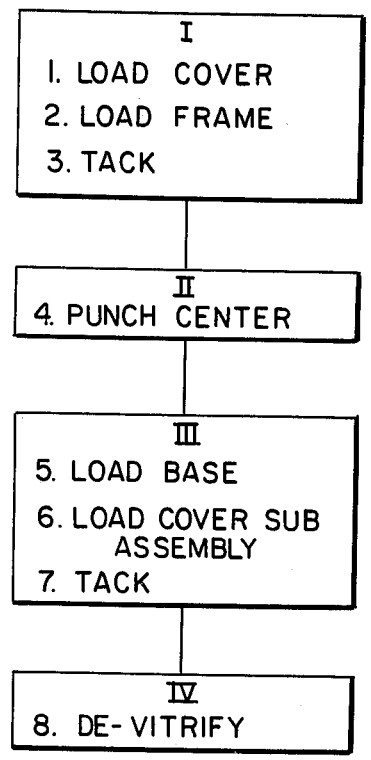
FIG. 8 is a schematic diagram illustrating assembly steps.
Figure 9:
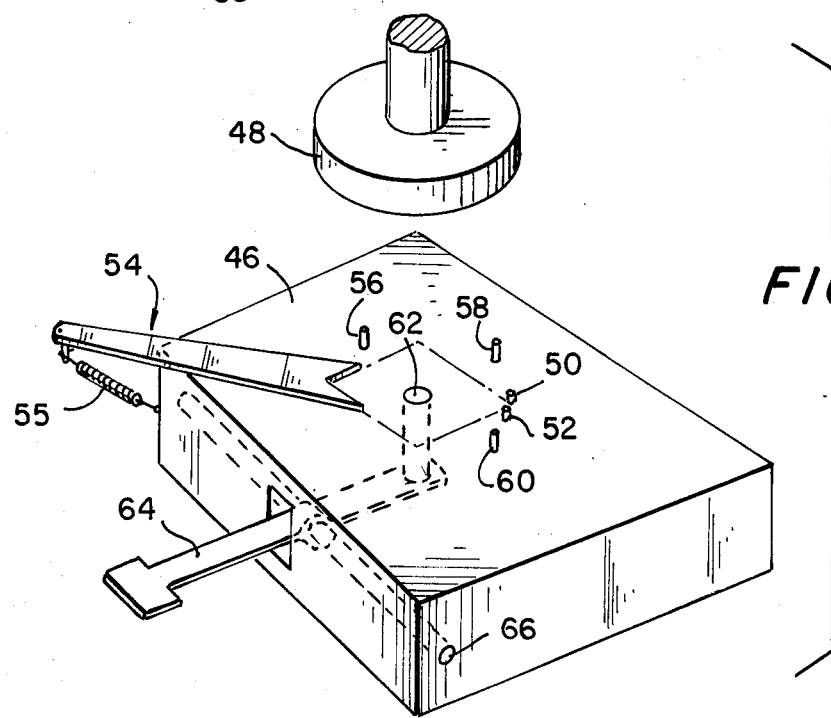
FIG. 9 is a perspective view of tooling fixtures used at Stages I and III of FIG. 8.

The assembly procedure is set forth schematically in FIG. 8, but the special tooling which in combination with frames 20 produces superior packages of the present invention is illustrated in FIG. 9. This tooling is used in assembly stages I and III most particularly, and incidentally in Stage II.

Understanding of the invention will be facilitated by considering how prior assembly tooling and procedures have contributed to dimensional inaccuracies and lack of co-planarity in finished packages.

The use of small tool presses in assembly of these parts is of course known. Generally, the base of the press is provided with a shallow cavity adapted to contain the ceramic part. The base has a heating element which will melt the solder glass in a short time. The lead frame is registered to the base by whatever means is provided, and a so-called "cold-foot," on the ram of the press, is actuated. It descends, pressing the frame and ceramic together while, at the same time, freezing the solder glass.

The use of a cavity in the base creates two problems: There must be a clearance for the part, which is hard to control accurately at the working temperature. Thus, the part can skew one way or another a few mils. This, when coupled with lead frame registration problems discussed more fully below, makes the production of packages with sufficient mis-registration to cause rejection a possibility, e.g. the yield of satisfactory parts will go down.

The second problem is that the floor of the cavity in the base can not be made perfectly flat, insofar as, being a cavity, it can not be ground flat on high-quality grinding equipment. As a result, the ceramic part can "float" in the cavity and co-planarity can be impaired. Again, reject rates may rise.

The solution to both of these problems involves elimination of a part-holding cavity altogether, and forms an important aspect of the present invention. First, the surface of the base and the bottom of the cold foot are ground to absolute flatness. As these are the surfaces that press the parts together, co-planarity is achieved. It is noted that the tool presses themselves are very accurately aligned and cause no problem.

The problem of positioning the ceramic workpiece in the absence of a cavity is overcome by what is referred to as "diagonal locking." A pair of pins are set in the base so that a corner of the work-piece can be pushed thereagainst. A sliding, spring mounted jaw diagonally opposed to the diagonal corner pins locks the workpiece in position on the diagonal of the workpiece. Again, the reference point is the exact center of the package. More important, by locking along the diagonal in an area directly over the heat source, the arrangement is substantially immune from thermal problems.

Accurate positioning of the lead frame with respect to the ceramic workpiece is a more complicated problem. If the heat source in the base was a point source radiating evenly in all directions, thermal compensation could be calculated, but of course no such source is available. If the source was very large and the entire base could be held at a precise temperature the problem would also be readily solvable. While such a source could be designed, radiated heat would be such that no operator would go near it and assembly is, after all, "close work."

As noted supra, the diagonal registration holes 30 are referenced to the center of the package, and three pins in the press base (on the three corners other than the corner with the locking jaw) do a good job of locating the frame, at least in lower lead count packages. However, such pins are located beyond what amount to the "corners" of the heating element, and it has been determined that heat flow was asymmetrical, and while expansion caused pins to move generally outward, it was not, speaking in terms of coordinates, the same in the X direction as in the Y direction. It was discovered that this problem is brought within satisfactory control limits, if not entirely eliminated, by providing the axial registration slots in the frame, as described supra, and using these to register on appropriately placed pins on the base. Apparently, the thermal expansion affecting such pins is axially uniform: when the source heats the base, they move out in a predictable axial direction. If the three pins are considered to be at 9, 12, and 3 o'clock with respect to the frame and the ceramic workpiece, the 12 o'clock pin secures the frame on the X-axis, and the 9 and 3 o'clock pins secure it on the Y axis, despite thermal effects. So, the three slots are adequate to position the center of the frame over the center of the package, the three registration points being determinative of frame position in a plane. The slots and the pins are, of course, referenced to the center point.

Part assembly is set forth in FIG. 8, and is discussed briefly below.

Stage I.

With the heater on, the operator loads in a ceramic cover ring 42, glass side up, and locks it in place with the jaw. While it is heating and the glass melting, a frame is placed over the respective pins. The foot pedal is depressed, the cold foot descends and presses ("tacks") the frame into the glass, registration and co-planarity being assured. After the foot rises, the operator must remove the part before the glass melts again, which can be done with tweezers or an ejection pin and tweezers. At this point, both position and planarity of the inner tips of leads 26 is assured.

Stage II.

The inner tie bars are punched out on a similar tool press. No heat is involved, and three (or four) diagonal pins on the bed, in conjunction with registration holes 30, will adequately position the part.

Stage III.

The operation of Stage I is essentially repeated, but in this instance the base 38 is diagonally locked on the base, glass-side up, and the lead frame-cover sub-assembly is attached thereto. Again, all the features assuring accurate registration and co-planarity are operative (in fact, the same tool may be used).

Stage IV.

After Stage III the package is essentially complete and accurate, but all the features of the invention brought about with the frame design and tooling as aforesaid can be lost if the last stage, devitrification of the solder glass, is carried out in a manner that allows the (now) unsupported lead tips to "wander" within the molten glass and lose their accuracy of registration, or permit movement of the ceramics with respect to the frame. Thus, while this step is carried out in a belt furnace, as is conventional, it is done in a manner that achieves devitrification while maintaining a high glass viscosity.

More particularly, most of the lead oxide borate solder glasses will devitrify in the range of 300° to 365° C., but devitrification, wherein the glass is converted from an amorphous to a crystalline state, is both temperature and time dependent. Viscosity is, on the other hand, temperature dependent, and is also dependent on the rate of temperature change in the amorphous range. In accordance with the invention, the parts are heated utilizing the devitrification characteristic in the range of 365° C. to 390° C. by ramping from ambient to 440° C. as slowly as possible while allowing approximately twenty minutes in the 440° C. temperature zone, and approximately five to ten minutes of cool down ramp to less than 150° C.

The ramping up in a controlled rate initiates the glass conversion so that when the 390° C. limit is achieved, the glass has become "substantially" devitrified. The term "substantial" is used in that given glass lots from a manufacturer will have slight but detectable variations in characteristics but will have the same guaranteed thermal physical properties. That is to say that the melt-devitrification exotherm and remelt temperatures will all be in a rate of temperature change and min/max temperature limits.

For exemplary purposes, solder glasses such as Corning 7583 or 7589, Owens Illinois CV97, CV11 or XS1175 are satisfactory for the present invention, being devitrifying lead oxide borate glasses. Of course, high-melting, non-devitrifying glasses may also be used, but with considerably different heating cycles.

For the noted preferred glasses, and in accordance with the preferred embodiment, the following heating cycle is a satisfactory devitrification profile: 1. Heat from ambient to the 350°–390° C. range in 10 minutes or less. 2. Hold in this range 25 min., ±5 min. 3. Heat to the 440°–510° C. range in 5 min. or less. 4. Hold in this range 20 min. ±5 min. 5. Ramp down to ambient in less than about 15 min.

FIG. 9 illustrates the tooling described above in connection with Stage I and III, but the tool press itself is not shown. The hot stage or base 46 is mounted on the press base and the cold foot 48 is mounted on the ram. Pins 50, 52 locate one corner of the ceramic part, and the diagonal-locking jaw structure, indicated generally at 54, locks the part. Separate sets of holes for pins 50, 52 are needed to accommodate full size covers and top-probe (e.g. smaller) covers. Obviously, pins 50, 52 must be no longer (e.g. higher) than the thickness of the ceramic. Pins 56, 58, 60 located on the X-Y axes, are preferably used to locate lead frame 20, as described supra.

It is preferred that jaw structure 54 be "T" shaped, the leg of the "T" being slidably engaged in a corresponding slot (not shown) in base 46, so that no wobble or mis-positioning of parts is possible. A spring 55 tensions jaw 54 toward the part.

Because there is no cavity in base 46, picking up tacked parts can be done with tweezers without any real problem. However, if desired, an ejection pin 62 activated by a lever 64 pivoted on a rod 66 may be employed, as could hydraulic or pneumatic or other pin actuating mechanisms, to lift the part off the base and facilitate its removal.

As noted above, holes 30 are preferably 100 mils whereas slots 34 are only 50. This is because 100 mil pins wear less and are easier for operators to work with: only during the critical assembly operations (Stages I and III) are the more precise 50 mil pins/slots preferred. This sizing is not critical.

Figure 10:
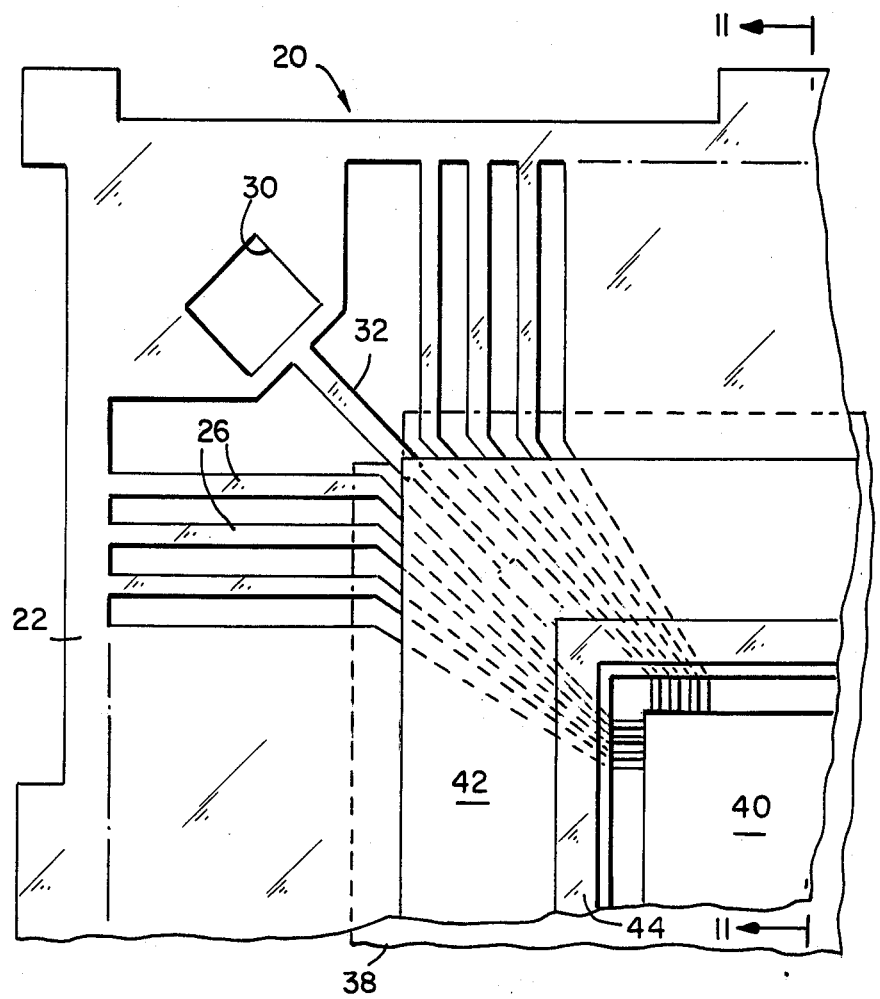
FIGS. 10 and 11 are a plan view and an cross-sectional elevation, respectively, of a completed package, showing only a portion of the leads.
Figure 11:
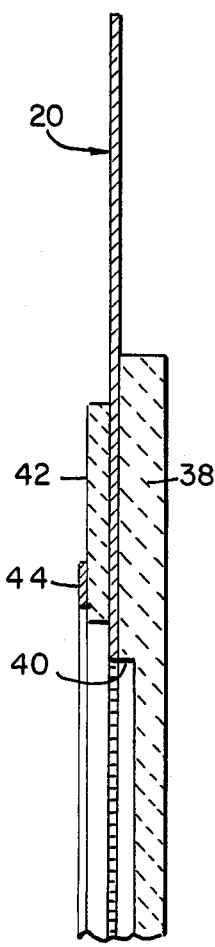

FIGS. 10 and 11 are a partial plan and elevation views of a complete package, with reference numbers as aforesaid, including die-attach area 40.

It will be appreciated that leaving the outer frame 22 intact including registration holes 30 not only provides good protection for the delicate leads 26 during handling and shipment, but registration holes 30 also provide reference points for both die attach and wire bond. By using these same points as were used during package assembly, position of the die is referenced to the die attach area, to the ceramic body and to the lead tips. The advantage for automatic wire bonding is manifest.

Further, the combination of registration and positioning pins, plus assured planarity of the working surfaces, guarantee a package on specification in the X, Y and Z planes.

Various changes in the details, steps, materials, and arrangements of parts, which have been herein described and illustrated to explain the nature of the invention may be made by those skilled in the art within the principle and scope of the invention as defined in the appended claims.

What is claimed is:

1. A lead frame for a semiconductor package comprising:
    a plurality of leads having their inner tips surrounding a designated circuit area and extending outwardly therefrom to outer ends;
    an internal tie bar connecting all said inner tips;
    an external frame member connecting all of said leads at said outer ends;
    said frame member being quadrilateral and including at least four registration holes on the diagonals thereof referenced to the exact center of said circuit area, whereby package assembly may be keyed to said center;
    said frame member additionally including four registration slots on the outer edge thereof on the X and Y axes, said slots being adapted to reference said frame to the center of said circuit area during hot stage assembly steps.

2. An integrated circuit package comprising:

a ceramic base having a central cavity on the upper surface thereof, the floor of said cavity comprising a designated circuit area;

a metal lead frame attached to said upper surface and having a plurality of leads with their inner tips surrounding said cavity and extending outwardly therefrom to outer ends connected by a quadrilateral external frame member, said frame member including at least four registration holes on the diagonals thereof referenced to the exact center of said circuit area;

four registration slots on the outer end of said frame member on the X and Y axes thereof, said slots being adapted to reference said frame to the center of said circuit area during hot stage assembly steps; and a ceramic cover attached to said frame and said base and including an opening larger than said cavity and in registration therewith.

* * * * *